US012666695B2

(12) United States Patent
Lin et al.

(10) Patent No.: US 12,666,695 B2
(45) Date of Patent: Jun. 23, 2026

(54) METHODS OF IMPROVING PMOS TRANSISTOR PERFORMANCE

(71) Applicant: Applied Materials, Inc., Santa Clara, CA (US)

(72) Inventors: Yongjing Lin, San Jose, CA (US); Zhihui Liu, Sunnyvale, CA (US); Sourav Garg, Santa Clara, CA (US); Lu Li, Santa Clara, CA (US); Haoming Yan, Santa Clara, CA (US); Haoyan Sha, San Jose, CA (US); Bhaskar Jyoti Bhuyan, San Jose, CA (US); Shih Chung Chen, Cupertino, CA (US); Janardhan Devrajan, Santa Clara, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 410 days.

(21) Appl. No.: 18/459,582

(22) Filed: Sep. 1, 2023

(65) Prior Publication Data

US 2025/0081593 A1     Mar. 6, 2025

(51) Int. Cl.
  *H10D 84/03*     (2025.01)
  *H10D 30/67*     (2025.01)
        (Continued)

(52) U.S. Cl.
  CPC ....... *H10D 84/038* (2025.01); *H10D 30/6735* (2025.01); *H10D 62/154* (2025.01);
        (Continued)

(58) Field of Classification Search
  CPC .......... H01L 21/0228; H01L 21/02532; H10D 84/0177; H10D 84/038; H10D 30/6735;
        (Continued)

(56) References Cited

U.S. PATENT DOCUMENTS

| | | |
|---|---|---|
| 11,245,022 B2 | 2/2022 | Lin et al. |
| 11,289,579 B2 | 3/2022 | Lin et al. |

(Continued)

FOREIGN PATENT DOCUMENTS

| | | |
|---|---|---|
| WO | 2019246574 A1 | 12/2019 |
| WO | 2021257392 A1 | 12/2021 |

OTHER PUBLICATIONS

"U.S. Appl. No. 18/126,583, filed Mar. 27, 2023, 53 pages".

(Continued)

*Primary Examiner* — Sonya McCall-Shepard
(74) *Attorney, Agent, or Firm* — SERVILLA WHITNEY LLC

(57) ABSTRACT

Methods of manufacturing electronic devices, such as transistors (negative metal-oxide-semiconductor (NMOS) transistors (e.g., an N-metal stack) and positive metal-oxide-semiconductor (PMOS) transistors (e.g., a P-metal stack)) are described. Embodiments of the disclosure are directed to methods of improving PMOS transistor performance by inhibiting N-metal layer growth. The present disclosure provides two types of processes to reduce or inhibit N-metal layer growth. The disclosure provides methods which include forming a self-assembled monolayer (SAM) on the metal surface (e.g., titanium nitride (TiN)) of the PMOS, and methods which include forming a silicon-containing layer such as silicon oxide (SiOx) on the TiN surface. These two types of processes significantly reduce or inhibit the subsequent growth of an N-metal layer, such as titanium aluminum carbide (TiAlC), on the TiN surface of the PMOS.

20 Claims, 6 Drawing Sheets

<u>100</u>

(51) Int. Cl.

| | |
|---|---|
| *H10D 62/13* | (2025.01) |
| *H10D 64/01* | (2025.01) |
| *H10D 84/01* | (2026.01) |
| *H10D 84/85* | (2025.01) |
| *H10P 14/20* | (2026.01) |
| *H10P 14/60* | (2026.01) |

(52) U.S. Cl.

CPC ....... *H10D 62/158* (2025.01); *H10D 84/0167* (2025.01); *H10D 84/853* (2025.01); *H10D 84/854* (2025.01); *H10P 14/3411* (2026.01); *H10P 14/6339* (2026.01)

(58) Field of Classification Search

CPC ............... H10D 62/154; H10D 62/158; H10D 84/0167; H10D 84/853; H10D 84/854; H10D 64/01; H10D 84/0165; H10D 84/85; H10D 84/0172–0179

See application file for complete search history.

(56) References Cited

U.S. PATENT DOCUMENTS

| | | | |
|---|---|---|---|
| 11,552,177 B2 | 1/2023 | Gandikota et al. | |
| 11,680,313 B2 | 6/2023 | Yu et al. | |
| 2012/0077319 A1 | 3/2012 | Lee et al. | |
| 2012/0181616 A1* | 7/2012 | Chudzik | H10D 84/0181 |
| | | | 257/E21.632 |
| 2016/0322213 A1* | 11/2016 | Thompson | C07F 7/00 |
| 2019/0189803 A1 | 6/2019 | Kloster et al. | |
| 2019/0316256 A1* | 10/2019 | Bhuyan | C23C 16/45553 |
| 2020/0168453 A1* | 5/2020 | Saly | H01L 21/76879 |
| 2020/0279777 A1 | 9/2020 | Zhang et al. | |
| 2020/0373404 A1 | 11/2020 | Lin et al. | |
| 2022/0275501 A1 | 9/2022 | Cervantes et al. | |
| 2022/0416048 A1 | 12/2022 | Smith et al. | |
| 2023/0072614 A1 | 3/2023 | Qu et al. | |
| 2023/0253248 A1 | 8/2023 | Zhou et al. | |
| 2023/0260791 A1 | 8/2023 | Gandikota | |
| 2024/0128346 A1* | 4/2024 | Frougier | H10D 30/6757 |

OTHER PUBLICATIONS

"U.S. Appl. No. 18/140,850, filed Apr. 28, 2023, 61 pages".
"U.S. Appl. No. 18/228,301, filed Jul. 31, 2023, 54 pages".
"U.S. Appl. No. 63/456,096, filed Mar. 31, 2023, 49 pages".
"U.S. Appl. No. 63/482,052, filed Jan. 29, 2023, 38 pages".
"U.S. Appl. No. 63/482,295, filed Jan. 30, 2023, 36 pages".
PCT International Search Report and Written Opinion in PCT/US2024/044092 dated Dec. 5, 2024, 9 pages.

* cited by examiner

<u>100</u>

<u>150</u>

200

200

300

300

METHODS OF IMPROVING PMOS TRANSISTOR PERFORMANCE

TECHNICAL FIELD

Embodiments of the present disclosure pertain to the field of electronic device manufacturing, and in particular, to transistors (negative metal-oxide-semiconductor (NMOS) transistors (e.g., an N-metal stack) and positive metal-oxide-semiconductor (PMOS) transistors (e.g., a P-metal stack)). More particularly, embodiments of the disclosure are directed to methods of improving PMOS transistor performance by inhibiting N-metal layer growth.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. the migration of transistor technology from planar field-effect transistors (FETs) to FinFET to gate-all-around (GAA) devices.

Shrinking of the materials currently used as NMOS transistors and PMOS transistors have become a challenge due to changes in basic properties, such as threshold voltage ($V_t$).

The rapid growth of mobile devices, internet of things (IoT), and machine learning are demanding greater transistor performance with lower power consumption. This requires the continuation of Moore's Law to shrink the size of transistor and double its density on a chip. One of the key challenges of transistor technology is to achieve greater band edge $V_t$ for PMOS transistors.

Due to the conventional process flow of forming metal-oxide-semiconductor capacitor (MOSCAP) structures and GAA devices (e.g., high-κ metal gate stacks), the deposition of an N-metal layer on a metal surface of a P-metal stack, such as a titanium nitride (TiN) surface, causes a $V_t$ shift toward the mid-gap by more than 100 mV, which limits the device performance. Current approaches include using a new P-type metal on instead of an N-metal layer on the TiN surface, but these approaches could not eliminate N-metal layer growth, and consequently, eliminate the detrimental effects of the N-metal layer on the P-metal stack. Additionally, it has been found that the new P-type metals themselves degrade overall device performance as compared to titanium nitride (TiN).

Accordingly, there is an ongoing need in the art for methods of improving PMOS transistor performance by inhibiting N-metal layer growth.

SUMMARY

One or more embodiments of the disclosure are directed to a method of manufacturing an electronic device. The method includes forming a P-metal stack and an N-metal stack on a semiconductor substrate. Each of the P-metal stack and the N-metal stack are formed on a top surface of a channel located between a source and a drain on the semiconductor substrate. In some embodiments, forming each of the P-metal stack and the N-metal stack comprises: depositing an interfacial layer on the top surface of the channel, depositing a high-κ dielectric layer on the interfacial layer, and depositing a P-metal layer on the high-κ dielectric layer on the P-metal stack. The method further includes exposing the semiconductor substrate to a blocking compound to selectively deposit a blocking layer on the P-metal layer; and selectively depositing an N-metal layer on the N-metal stack.

Additional embodiments of the disclosure are directed to a method of manufacturing an electronic device. The method includes forming a P-metal stack and an N-metal stack on a semiconductor substrate. Each of the P-metal stack and the N-metal stack are formed on a top surface of a channel located between a source and a drain on the semiconductor substrate. In some embodiments, forming each of the P-metal stack and the N-metal stack comprises: depositing an interfacial layer on the top surface of the channel, depositing a high-κ dielectric layer on the interfacial layer, and depositing a P-metal layer on the high-κ dielectric layer on the P-metal stack. The method further includes exposing the semiconductor substrate to a silicon-containing precursor to selectively deposit a silicon-containing layer on the P-metal layer; and selectively depositing an N-metal layer on the N-metal stack.

Further embodiments of the disclosure are directed to a method of manufacturing an electronic device. The method includes forming a P-metal stack and an N-metal stack on a semiconductor substrate. Each of the P-metal stack and the N-metal stack are formed on a top surface of a channel located between a source and a drain on the semiconductor substrate. In some embodiments, forming each of the P-metal stack and the N-metal stack comprises: depositing a silicon oxide (SiOx) layer on the top surface of the channel, depositing a hafnium oxide (HfOx) layer on the SiOx layer, and depositing a titanium nitride (TiN) layer on the HfOx layer on the P-metal stack. The method further includes exposing the semiconductor substrate to a blocking compound to selectively deposit a blocking layer on the TiN layer at a temperature in a range of from room temperature to 500° C. and a pressure in a range of from 0.1 Torr to 100 Torr, the blocking compound comprising a formula of $R_1$—C≡C—$R_2$, where each of $R_1$ and $R_2$ are independently (H) or an alkyl group, a formula of H—C≡C—$R_3$, where $R_3$ is an alkyl group, a formula of R—$SiH_3$, where R is an alkyl group, a formula of R—$SiCl_3$, where R is an alkyl group, or a formula of R—SH, where R is an alkyl group; and selectively depositing a titanium aluminum carbide (TiAlC) layer on the N-metal stack.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
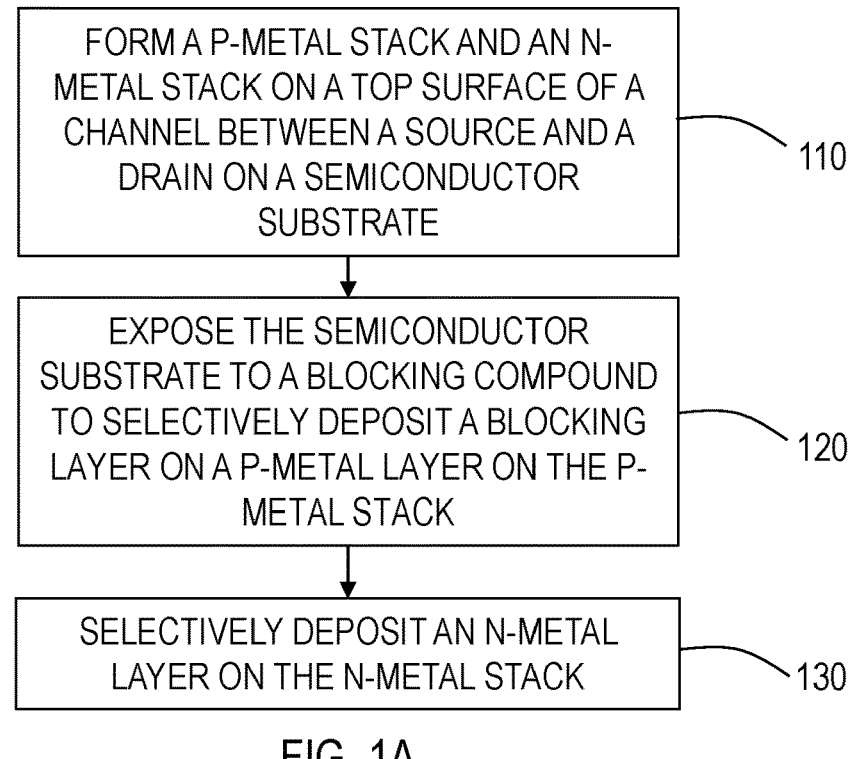
FIG. 1A illustrates a process flow diagram of a method of manufacturing an electronic device according to one or more embodiments of the present disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

One or more of the layers deposited on the substrate or substrate surface are continuous. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer.

In an embodiment of a spatial ALD process, a first reactive gas and second reactive gas (e.g., hydrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate, such as a semiconductor substrate, and exhibit a doping profile suitable for a particular application. The gate is positioned over the channel region and includes a gate dielectric interposed between a gate electrode and the channel region in the semiconductor substrate.

As used herein, the term "field effect transistor" or "FET" refers to a transistor that uses an electric field to control the electrical behavior of the device. Field effect transistors are voltage controlled devices where their current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated $I_D$. Drain-to-source voltage is designated $V_{DS}$. By applying voltage to gate (G), the current entering the channel at the drain (i.e., 1D) can be controlled.

The metal-oxide-semiconductor field-effect transistor (MOSFET) is a type of field-effect transistor (FET) and is used in integrated circuits and high speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or NMOS FET, then the source and drain are n+ regions and the body is a p-type substrate region. If the MOSFET is a p-channel or PMOS FET, then the source and drain are p+ regions and the body is an n-type substrate region. The source is so named because it is the source of the charge carriers (electrons for n-channel, holes for p-channel) that flow through the channel; similarly, the drain is where the charge carriers leave the channel.

A NMOS FET is made up of an n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode and saturation. Circuits with NMOS logic gates dissipate static power when the circuit is idling, since DC current flows through the logic gate when the output is low.

A PMOS FET is made up of p-type source and drain and an n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said to have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS integrated circuits would be smaller than PMOS integrated circuits (that give the same functionality), since the NMOS can provide one-half of the impedance provided by a PMOS (which has the same geometry and operating conditions).

As used herein, the term "fin field-effect transistor (FinFET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nanoslabs or nanosheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

Embodiments of the present disclosure advantageously provide methods of manufacturing electronic devices (e.g., PMOS transistors) that meet $V_t$ requirements and have improved device performance and reliability. Embodiments of the disclosure improve $V_t$ significantly without EOT penalty due to a new integration scheme.

Due to the conventional process flow of forming MOSCAP structures and GAA devices (e.g., high-κ metal gate stacks), the deposition of an N-metal layer on top of a P-metal stack having a P-metal layer (e.g., titanium nitride (TiN)) will cause the $V_t$ shift toward mid gap by more than 100 mV, which limits the device performance. Additionally, it has been found that the new P-type metals themselves degrade overall device performance as compared to titanium nitride (TiN). Embodiments of the present disclosure advantageously reduce the $V_t$ shift toward the mid gap without using a new P-type metal.

Embodiments of the disclosure advantageously provide methods of reducing growth of N-metal layers on the PMOS (e.g., the P-metal stack) to enhance the PMOS performance. The methods of reducing growth of N-metals on the PMOS transistors simplify the integration scheme and reduces integration cost, as compared to patterning processes.

The present disclosure provides two types of processes to reduce N-metal layer growth. It has been advantageously found that both of the two types of processes described herein provide a gain of greater than or equal to 50 mV.

Some embodiments advantageously provide methods which include forming a self-assembled monolayer (SAM). Due to the selectivity of the SAM, the SAM selectively absorbs on a metal surface, such as titanium nitride (TiN), and not on a dielectric surface, such as a high-κ dielectric layer. Advantageously, the subsequent growth of an N-metal layer, such as titanium aluminum carbide (TiAlC) on the TiN surface of the PMOS can be eliminated entirely or at least significantly reduced due to the SAM inhibition. As used herein, the subsequent growth of an N-metal layer that is "significantly reduced" refers to an N-metal layer that has a thickness in a range of from 0.1 Å to 10 Å, which corresponds to a reduction of growth that is greater than or equal to 50%, including greater than or equal to 60%, or greater than or equal to 70% than the growth an N-metal layer on an N-metal stack.

Some embodiments advantageously provide methods which include forming a silicon-containing layer, such as silicon oxide (SiOx). It has been advantageously found that forming a silicon oxide (SiOx) layer on a metal surface, such as titanium nitride (TiN), and not on a dielectric surface, such as a high-κ dielectric layer, significantly reduces the subsequent growth of an N-metal layer, such as titanium aluminum carbide (TiAlC) on the TiN surface of the PMOS. As used herein, a silicon oxide (SiOx) layer that "significantly reduces" subsequent growth of an N-metal layer refers to an N-metal layer that has a thickness in a range of from 0.1 Å to 10 Å, which corresponds to a reduction of growth that is greater than or equal to 50%, including greater than or equal to 60%, or greater than or equal to 70% than the growth an N-metal layer on an N-metal stack.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1A illustrates a process flow diagram of a method 100 of forming an electronic device 200. The electronic device 200 (e.g., the GAA transistor) shown in FIGS. 2A-2D may be manufactured by the method 100 illustrated in FIG. 1A.

The method 100 comprises: forming a P-metal stack and an N-metal stack on a semiconductor substrate at operation 110. Each of the P-metal stack and the N-metal stack are formed on a top surface of a channel located between a source and a drain on the semiconductor substrate. In some embodiments, forming each of the P-metal stack and the N-metal stack comprises: depositing an interfacial layer on the top surface of the channel, depositing a high-κ dielectric layer on the interfacial layer, and depositing a P-metal layer on the high-κ dielectric layer on the P-metal stack. The method 100 further includes exposing the semiconductor substrate to a blocking compound to selectively deposit a blocking layer on the P-metal layer (operation 120); and selectively depositing an N-metal layer on the N-metal stack (operation 130). In some embodiments, the method 100 consists essentially of operation 110, operation 120, and operation 130. In some embodiments, the method 100 consists of operation 110, operation 120, and operation 130.

Figure 1B:
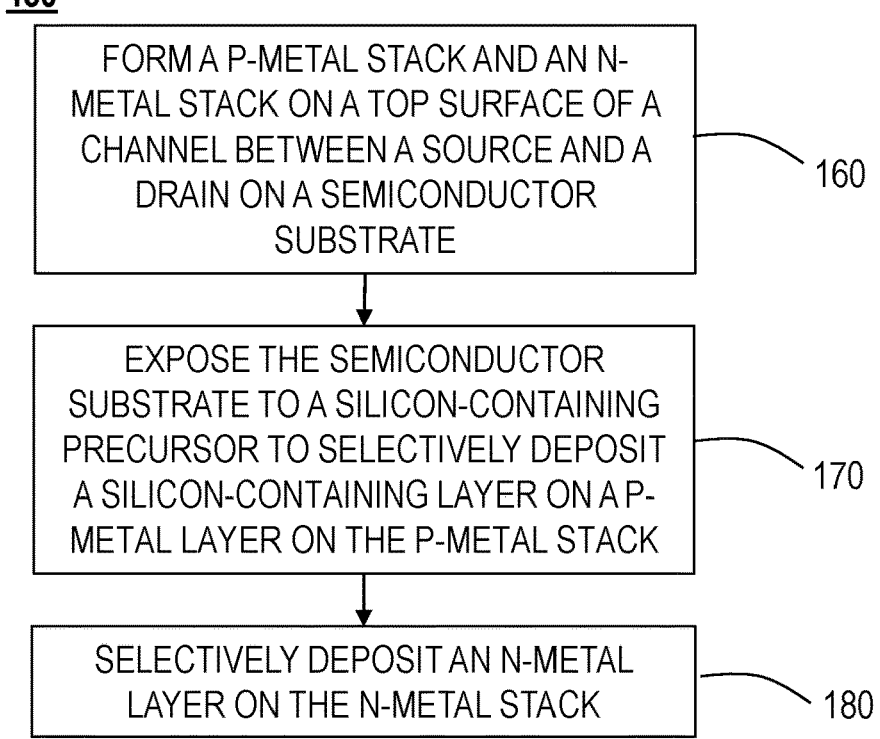
FIG. 1B illustrates a process flow diagram of a method of manufacturing an electronic device according to one or more embodiments of the present disclosure.

FIG. 1B illustrates a process flow diagram of a method 150 of forming an electronic device 300. The electronic device 300 (e.g., the GAA transistor) shown in FIGS. 3A-3D may be manufactured by the method 150 illustrated in FIG. 1B.

The method 150 comprises: forming a P-metal stack and an N-metal stack on a semiconductor substrate at operation 160. Each of the P-metal stack and the N-metal stack are formed on a top surface of a channel located between a source and a drain on the semiconductor substrate. In some embodiments, forming each of the P-metal stack and the N-metal stack comprises: depositing an interfacial layer on the top surface of the channel, depositing a high-κ dielectric layer on the interfacial layer, and depositing a P-metal layer on the high-κ dielectric layer on the P-metal stack. The method 150 further includes exposing the semiconductor substrate to a silicon-containing precursor to selectively deposit a silicon-containing layer on the P-metal layer on the P-metal stack (operation 170); and selectively depositing an N-metal layer on the N-metal stack (operation 180). In some embodiments, the method 150 consists essentially of operation 160, operation 170, and operation 180. In some embodiments, the method 150 consists of operation 160, operation 170, and operation 180.

Referring to FIGS. 1A and 2A-2D, the electronic device 200 includes a semiconductor substrate 202 having a top surface 203. The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 202 comprises one or more of silicon (Si), germanium (Ge), gallium (Ga), arsenic (As), indium (In), phosphorus (P), or selenium (Se). Although a few examples of materials from which the semiconductor substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 202 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In one or more embodiments, a source region 204a is on the top surface 203 of the semiconductor substrate 202. In one or more embodiments, the source region 204a has a source and a source contact (not illustrated). A drain region 204b is on the top surface 203 of the semiconductor substrate 202 opposite the source region 204a. In one or more embodiments, the drain region 204b has a drain and a drain contact (not illustrated).

In one or more embodiments, the source region 204a and/or the drain region 204b can be any suitable material known to the skilled artisan. In one or more embodiments, the source region 204a and/or the drain region 204b may have more than one layer. For example, the source region 204a and/or the drain region 204b may independently comprise three layers. In one or more embodiments, the source region 204a and the drain region 204b may independently comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source region 204a and the drain region 204b may independently comprise a bottom layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like. In some embodiments, the source region 204a and the drain region 204b may be raised source/drain regions formed by EPI growth.

In one or more embodiments, the source contact and/or the drain contact may independently be selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more embodiments, formation of the source contact and/or the drain contact is conducted by any suitable process known to the skilled artisan, including, but not limited to ALD, CVD, PVD, MBE, MOCVD, spin-on, or other insulating layer deposition techniques known to the skilled artisan.

In one or more embodiments, a channel 206 is located between the source region 204a and the drain region 204b. In some embodiments, the channel 206 comprises n-type material or p-type material. In some embodiments, the channel 206 comprises one or more of silicon (Si) or silicon oxide (SiOx).

In one or more embodiments, an interfacial layer 210 is deposited on a top surface 205 of the channel 206. In one or more embodiments, the interfacial layer 210 can be any suitable material known to the skilled artisan. For example, in one or more embodiments, the interfacial layer 210 comprises a silicon oxide (SiOx) layer formed on doped silicon or undoped silicon. In one or more embodiments, the interfacial layer 210 comprises silicon dioxide ($SiO_2$). In other embodiments, the dielectric material is a low-K material. In one or more embodiments, the interfacial layer 210 may be formed on the top surface 205 of the channel 206 by any of the processes described herein with respect to operation 110. In one or more embodiments, the interfacial layer 210 has a thickness in a range of 1 Å to 10 Å.

In one or more embodiments, a high-κ dielectric layer 212 is deposited on a top surface 211 of the interfacial layer 210 using a deposition technique, such as, but not limited to, ALD, CVD, PVD, MBE, MOCVD, spin-on, or other insulating layer deposition techniques known to the skilled artisan. In some embodiments, at operation 120, the high-κ dielectric layer 212 is conformally deposited by ALD.

The high-κ dielectric layer 212 comprises one or more of hafnium oxide (HfOx), hafnium zirconium oxide (HfZrOx), zirconium oxide (ZrOx), nitrogen-doped hafnium oxide (HfOx), nitrogen-doped hafnium zirconium oxide (HfZrOx), and nitrogen-doped zirconium oxide (ZrOx).

The high-κ dielectric layer 212 may have any suitable thickness. In one or more embodiments, the high-κ dielectric layer 212 has a thickness in a range of 5 Å to 20 Å.

In some embodiments, the P-metal layer 214 is deposited on a top surface 213 of the high-κ dielectric layer 212 using a deposition technique, such as, but not limited to, ALD, CVD, PVD, MBE, MOCVD, spin-on, or other insulating layer deposition techniques known to the skilled artisan.

In some embodiments, depositing the P-metal layer 214 comprises exposing the semiconductor substrate 202 to a pulse of a metal-containing precursor and a pulse of a reactant (e.g., a nitrogen-containing reactant) by an atomic layer deposition (ALD) process or a chemical vapor deposition (CVD) process. In some embodiments, the semiconductor substrate 202 is purged after each pulse.

In one or more specific embodiments, the P-metal layer 214 is deposited by atomic layer deposition (ALD). In one or more embodiments, the P-metal layer 214 is deposited by atomic layer deposition (ALD) at a temperature in the range of about 200° C. to about 600° C. In one or more embodiments, the P-metal layer 214 is deposited by atomic layer deposition (ALD) at a temperature less than or equal to about 450° C. In one or more embodiments, the P-metal layer has a thickness in a range of 1 Å to 10 Å, or in a range of 2 Å to 5 Å. In one or more specific embodiments, the P-metal layer has a thickness in a range of 3 Å to 4 Å.

In one or more embodiments, the P-metal layer 214 comprises a metal nitride layer. In some embodiments, the P-metal layer 214 comprises one or more of titanium nitride (TiN), tungsten carbonitride (WCN), tungsten nitride (WN), molybdenum nitride (MoN), tantalum nitride (TaN), niobium nitride (NbN), or titanium silicon nitride (TiSiN).

Figure 2A:
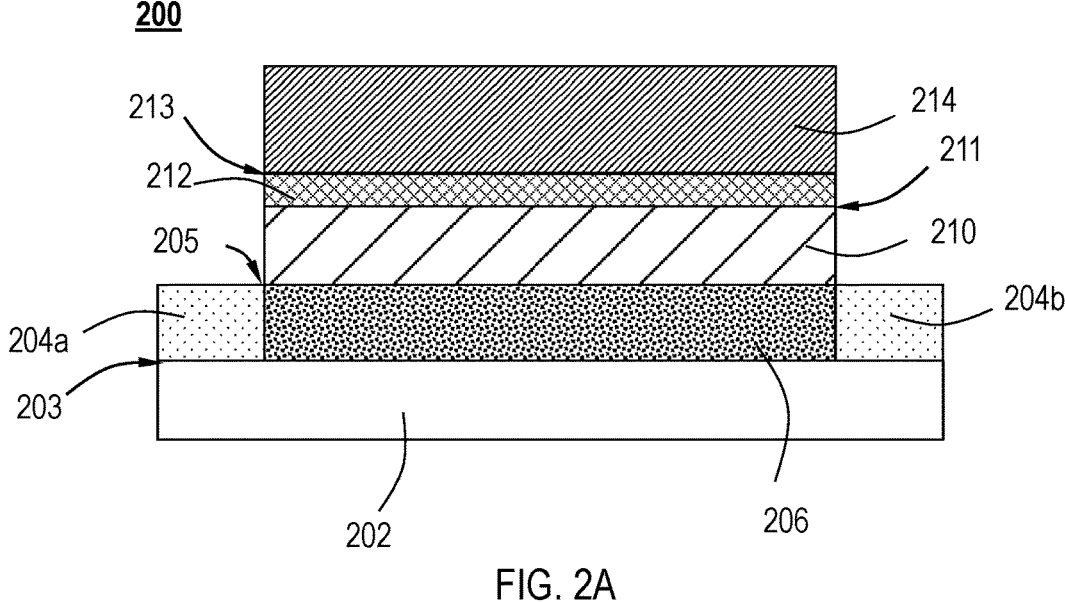
FIG. 2A illustrates a cross-sectional view of a semiconductor substrate according to one or more embodiments of the present disclosure.
Figure 2B:
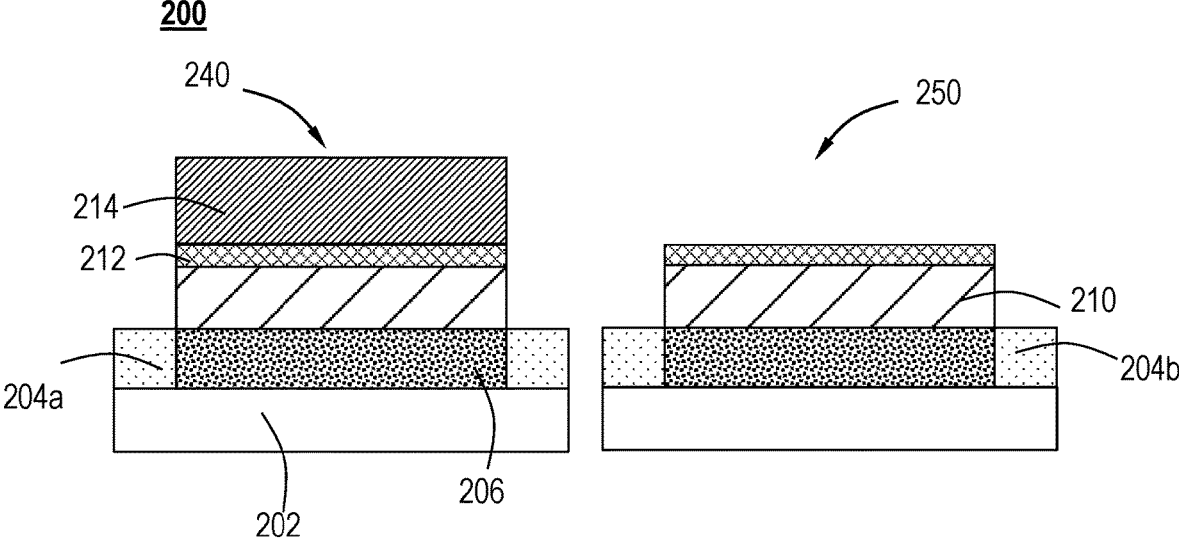
FIG. 2B illustrates a cross-sectional view of a semiconductor substrate according to one or more embodiments of the present disclosure.

In FIG. 2B, a P-metal stack 240 and an N-metal stack 250 are shown. The present disclosure provides two types of processes to reduce or inhibit N-metal layer growth on the P-metal stack 240. The disclosure provides methods which include forming a self-assembled monolayer (SAM) on the metal surface (e.g., P-metal layer 214) of the P-metal stack 240, and methods which include forming a silicon-containing layer such as silicon oxide (SiOx) on the P-metal layer 214. These two types of processes significantly reduce or inhibit the subsequent growth of an N-metal layer, such as titanium aluminum carbide (TiAlC), on the P-metal layer 214.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor. For example, a self-assembled monolayer (SAM) can be formed on a surface to prevent subsequent deposition on that surface.

Figure 2C:
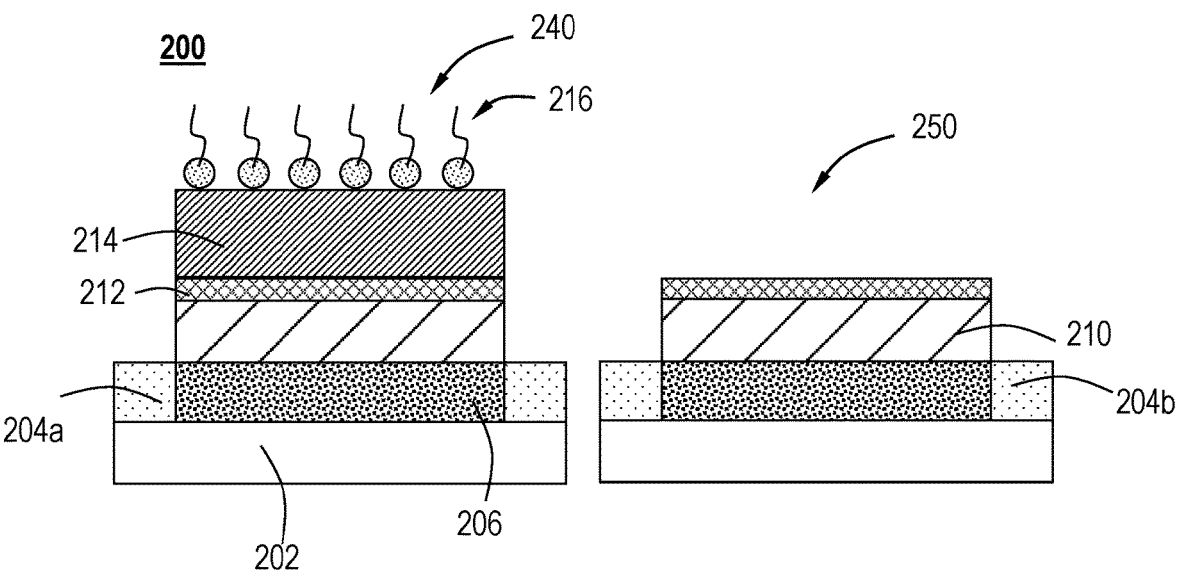
FIG. 2C illustrates a cross-sectional view of a semiconductor substrate according to one or more embodiments of the present disclosure.

FIGS. 1A and 2C illustrate operation 120 of method 100: exposing the semiconductor substrate 202 to a blocking compound 216 to selectively deposit a blocking layer on the P-metal layer 214. In FIG. 2C, the blocking compound 216 is denoted by a head group (the circles) and a tail group (the squiggled lines), as will be understood and appreciated by the skilled artisan.

It has been found that the head group of the blocking compound 216 selectively reacts and binds to the target surface, e.g., the P-metal layer 214. The blocking compound 216 may form on the target surface to form a blocking layer that is "continuous" as defined herein. Accordingly, the skilled artisan will appreciate that the blocking layer will prevent subsequent deposition, e.g., on the P-metal layer 214, even if the blocking layer is not a continuous layer.

The binding affinity properties and hydrophobicity of the blocking compound 216 can be tuned by adjusting one of the position, length, size and number of substitute R, $R_1$, or $R_2$ groups of the tail end on any substitution site of a head group.

In one or more embodiments, the blocking compound 216 comprises a compound comprising an unsaturated hydrocarbon or a saturated hydrocarbon, a silicon-containing compound, or a sulfur-containing compound. The compounds comprising the unsaturated hydrocarbon and/or the saturated hydrocarbon include at least one alkyl group having any suitable number of carbon atoms. As used herein, the term "alkyl group" or "alkyl chain" should construed as including, but not limited to, an acyclic group, such as a linear alkyl group or a branched alkyl group, and a cyclic alkyl group.

In one or more embodiments, the blocking compound 216 comprises a formula of $R_1$—C≡C—$R_2$, where each of $R_1$ and $R_2$ are independently hydrogen (H) or an alkyl group. In embodiments where the blocking compound 216 comprises the formula of $R_1$—C≡C—$R_2$, where each of $R_1$ and $R_2$ are independently hydrogen (H) or an alkyl group, $R_1$ and $R_2$ may or may not be the same. In some embodiments, the blocking compound 216 comprises the formula of $R_1$—C≡C—$R_2$, where each of $R_1$ and $R_2$ are independently hydrogen (H) or an alkyl group comprising 1 to 20 carbon atoms. In one or more embodiments, each of $R_1$ and $R_2$ are independently hydrogen (H) or a linear alkyl chain comprising 1 to 20 carbon atoms. In one or more embodiments, $R_1$ and $R_2$ are the same.

In embodiments where the blocking compound 216 comprises the formula of $R_1$—C≡C—$R_2$, the head group includes the triple bonded carbons (denoted by the circles in FIG. 2C), and the tail group (denoted by the squiggled lines) includes $R_1$ and $R_2$. Accordingly, in embodiments where the blocking compound 216 comprises the formula of $R_1$—C≡C—$R_2$, the carbon atoms from the triple bonded carbons selectively react and bind to the target surface, e.g., the P-metal layer 214.

In one or more embodiments, the blocking compound 216 comprises a formula of H—C≡C—$R_3$, where $R_3$ is an alkyl group. In one or more embodiments, the blocking compound 216 comprises the formula of H—C≡C—$R_3$, where $R_3$ is an alkyl group comprising from 1 to 20 carbon atoms. In one or more embodiments, $R_3$ is a linear alkyl chain comprising from 1 to 20 carbon atoms.

In one or more embodiments where the blocking compound 216 comprises the formula of H—C≡C—$R_3$, the head group includes the triple bonded carbons, and the tail group includes $R_3$. Accordingly, in embodiments where the blocking compound 216 comprises the formula of H—C≡C—$R_3$, the carbon atoms from the triple bonded carbons selectively react and bind to the target surface, e.g., the P-metal layer 214.

In one or more embodiments, the blocking compound 216 comprises a formula of R—$SiH_3$, where R is an alkyl group. In one or more embodiments, R is selected from a linear alkyl chain and a branched alkyl chain comprising from 1 to 20 carbon atoms.

In one or more embodiments where the blocking compound 216 comprises the formula of R—$SiH_3$, the head group includes the silicon (Si) atom, and the tail group includes R. Accordingly, in embodiments where the blocking compound 216 comprises the formula of R—$SiH_3$, the silicon (Si) atom selectively reacts and binds to the target surface, e.g., the P-metal layer 214.

In one or more embodiments, the blocking compound 216 comprises a formula of R—$SiCl_3$, where R is an alkyl group. In one or more embodiments, R is selected from a linear alkyl chain and a branched alkyl chain comprising from 1 to 20 carbon atoms.

In one or more embodiments where the blocking compound 216 comprises the formula of R—$SiCl_3$, the head group includes the silicon (Si) atom, and the tail group includes R. Accordingly, in embodiments where the blocking compound comprises the formula of R—$SiCl_3$, the silicon (Si) atom selectively reacts and binds to the target surface, e.g., the P-metal layer 214.

In one or more embodiments, the blocking compound 216 comprises a formula of R—SH, where R is an alkyl group. In one or more embodiments, R is selected from a linear alkyl chain and a branched alkyl chain comprising from 1 to 20 carbon atoms.

In one or more embodiments where the blocking compound 216 comprises the formula of R—SH, the head group includes the sulfur (S) atom, and the tail group includes R. Accordingly, in embodiments where the blocking compound 216 comprises the formula of R—SH, the sulfur (S) atom selectively reacts and binds to the target surface, e.g., the P-metal layer 214.

In one or more embodiments, the blocking compound 216 is carried in an inert carrier gas, for example, argon (Ar) gas or nitrogen ($N_2$) gas. The blocking compound 216 inhibits or blocks deposition on the surface on which it is formed.

In some embodiments, the semiconductor substrate 202 is soaked in a vapor of the blocking compound 216.

In some embodiments, the processing conditions for exposing the semiconductor substrate 202 to the blocking compound 216 may be controlled.

In some embodiments, the pressure of the processing chamber is controlled. The pressure of the processing chamber may be any suitable pressure for forming the blocking layer. In some embodiments, the pressure of the processing chamber is maintained in a range of from 1 Torr to 100 Torr.

In one or more embodiments, a flow of argon (Ar) gas is configured to carry the blocking compound from a container to the processing chamber. In some embodiments, the flow rate of the argon (Ar) gas that is configured to carry the blocking compound 216 into the processing chamber is controlled. The flow rate of the argon (Ar) gas may be any suitable flow rate for forming the blocking layer. In some embodiments, the flow rate of the argon (Ar) gas is in a range of about 10 sccm to about 3000 sccm.

In some embodiments, the "time period" or the "soak period", during which the blocking compound 216 is exposed to the semiconductor substrate 202, is controlled. The soak period may be any suitable period for forming the blocking layer. In some embodiments, the soak period is in a range of from about 0.5 seconds to about 1 hour.

In one or more embodiments, the blocking compound 216 is in a liquid phase when the blocking compound 216 is in a container, such as an ampoule or a cylinder, from which the blocking compound 216 is delivered to the chamber in a carrier gas. In some embodiments, the blocking compound 216 is in a saturated vapor phase in the container when the container has a pressure of about 0.1 torr. In one or more embodiments, a temperature of the container is lower than the temperature in the processing chamber. In one or more embodiments, a carrier gas such as argon (Ar) gas carries the saturated vapor phase blocking compound 216 from the container to the processing chamber. In some embodiments, a temperature of the processing chamber is controlled during exposure to the blocking compound. The temperature of the processing chamber may also be referred to as the operating temperature.

In some embodiments, the temperature of the processing chamber is in a range of room temperature (from about 20 to about 22° C. inclusive) to about 500° C., or in a range of about 50° C. to about 450° C.

As the technology node advances, for example, when scaling semiconductor devices to the 3 nm node and beyond back-end-of-line (BEOL) includes new interfaces such as tungsten (W), molybdenum (Mo), and ruthenium (Ru). Improving blocking compound 216 (e.g., self-assembled monolayer (SAM)) selectivity on metal to low-K surfaces becomes more challenging, especially when these interfaces contain different kinds of impurities such as oxygen, carbon, nitrogen, fluorine, chlorine, etc. It has been determined that the cleaning (e.g., pre-cleaning) before blocking compound processes further improves blocking compound selectivity. Without intending to be bound by theory, it is thought that pre-cleaning also helps control damage to low-K dielectric materials.

In some embodiments, the P-metal layer 214 is cleaned prior to exposing the semiconductor substrate 202 to the blocking compound 216.

In some embodiments, the surface of the P-metal layer 214 is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma is formed by a remote plasma source. In some embodiments, the hydrogen plasma comprises plasma of $H_2$. In some embodiments, the hydrogen plasma comprises, consists essentially of, or consists of a combination of argon (Ar) and hydrogen ($H_2$). In some embodiments, the hydrogen plasma comprises, consists essentially of, or consists of a combination of helium (He) and hydrogen ($H_2$).

Pre-cleaning of the P-metal layer 214 can occur at any suitable temperature depending on, for example, the cleaning technique. In some embodiments, pre-cleaning of the P-metal layer 214 occurs at the same temperature as exposing the semiconductor substrate 202 to the blocking compound 216, e.g., a temperature in a range of from room temperature to 500° C.

Figure 2D:
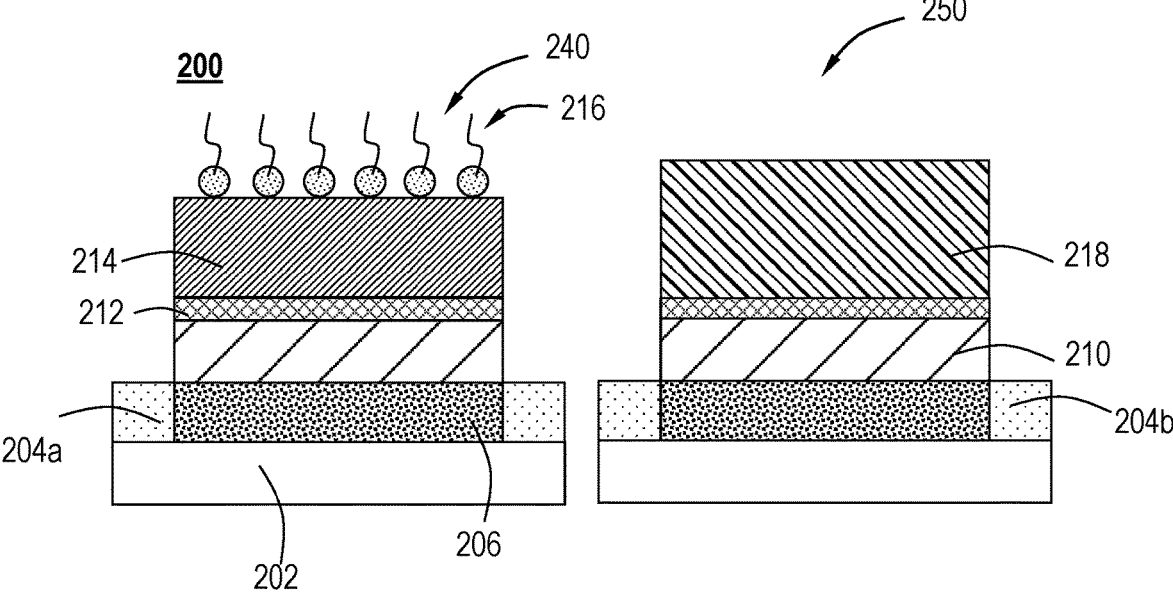
FIG. 2D illustrates a cross-sectional view of a semiconductor substrate according to one or more embodiments of the present disclosure.

FIGS. 1A and 2D illustrate operation 130: selectively depositing an N-metal layer 218 on the N-metal stack 250. Advantageously, the blocking compound 216 (and resulting blocking layer) and the method 100 inhibits growth of the N-metal layer 218 on the P-metal layer 214 (shown in FIG. 2D) and improves a threshold voltage ($V_t$) of the electronic device 200 compared to a method that does not include selectively depositing a blocking layer on the P-metal stack.

In some embodiments, at operation 130, the N-metal layer 218 is deposited on the high-κ dielectric layer 212 using a deposition technique, such as, but not limited to, ALD, CVD, PVD, MBE, MOCVD, spin-on, or other insulating layer deposition techniques known to the skilled artisan.

The N-metal layer 218 may comprise any suitable metal known to the skilled artisan. In some embodiments, the N-metal layer 218 comprises one or more of aluminum (Al), titanium (Ti), titanium carbide (TiC), titanium aluminum carbide (TiAlC), titanium aluminum silicon (TiAlSi), tantalum (Ta), tantalum carbide (TaC), tantalum aluminum carbide (TaAlC), or tantalum aluminum silicon (TaAlSi).

In one or more embodiments, the N-metal layer 218 has a thickness in a range of from less than or equal to 2 nm to less than or equal to 5 nm.

The embodiments as described herein are illustrated by way of example and not limitation in the figures of the accompanying drawings in which like references indicate similar elements.

Referring to FIGS. 1B and 3A-3D, the electronic device 300 includes a semiconductor substrate 302 having a top surface 303. The electronic device 300 of FIGS. 3A-3D includes similar elements as the electronic device 200 of FIGS. 2A-2D. For example, the semiconductor substrate 202, the top surface 203, the source region 204a and the drain region 204b on the top surface 203, the channel 206 located between the source region 204a and the drain region 204b, the interfacial layer 210 on the top surface 205 of the channel 206, the high-κ dielectric layer 212 on the top surface 211 of the interfacial layer 210, the P-metal layer 214 on the top surface 213 of the high-κ dielectric layer 212 on the P-metal stack 240 indicate the following similar elements in FIGS. 3A-3D: the semiconductor substrate 302, the top surface 303, source region 304a and the drain region 304b on the top surface 303, channel 306 located between the source region 304a and the drain region 304b, interfacial layer 310 on top surface 305 of the channel 306, high-κ dielectric layer 312 on the top surface 311 of the interfacial layer 310, and the P-metal layer 314 on the top surface 313 of the high-κ dielectric layer 312 on the P-metal stack 340. Accordingly, the electronic device 200 of FIGS. 2A and 2B and the electronic device 300 of FIGS. 3A and 3B may include the same or similar elements and can be described interchangeably.

Figure 3A:
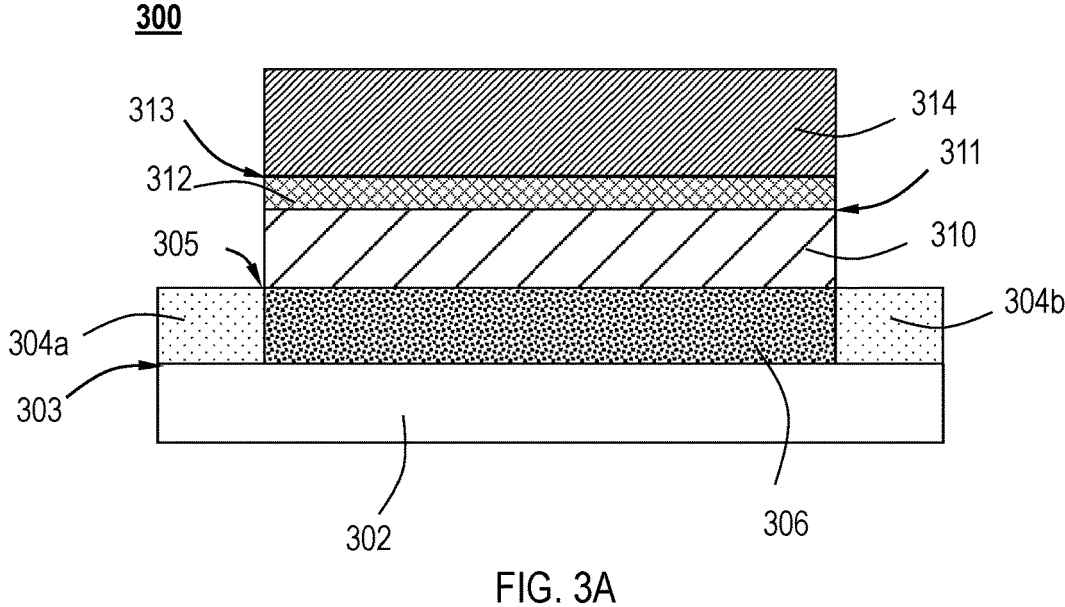
FIG. 3A illustrates a cross-sectional view of a semiconductor substrate according to one or more embodiments of the present disclosure.
Figure 3B:
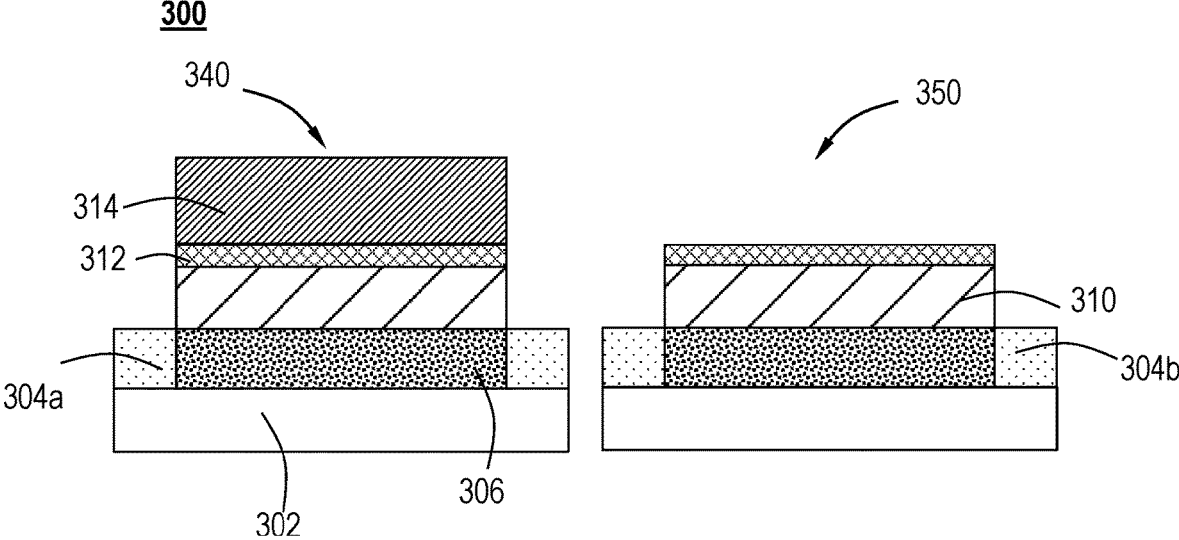
FIG. 3B illustrates a cross-sectional view of a semiconductor substrate according to one or more embodiments of the present disclosure.
Figure 3C:
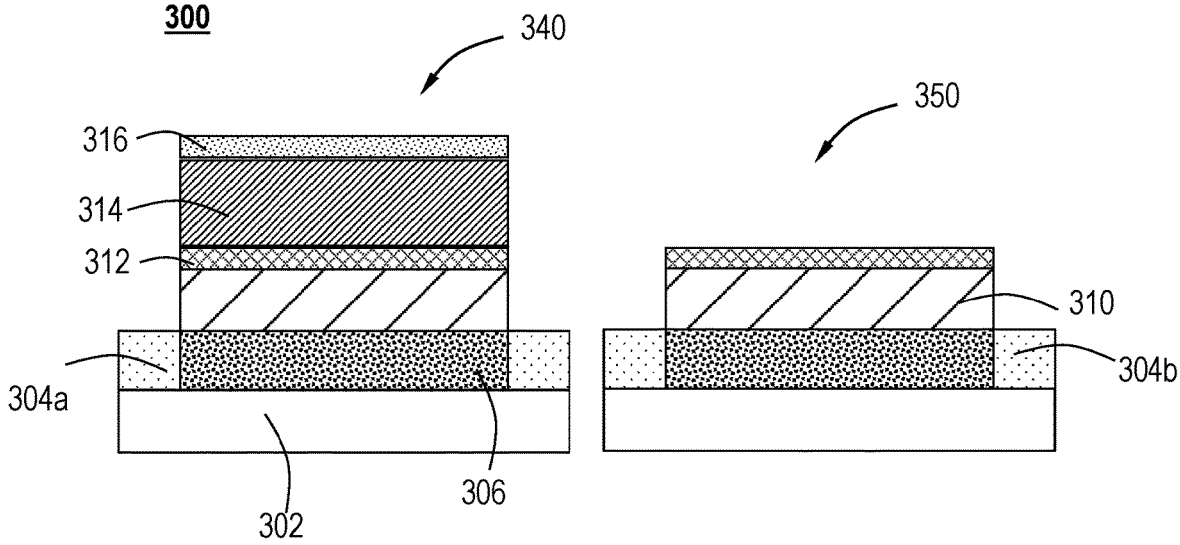
FIG. 3C illustrates a cross-sectional view of a semiconductor substrate according to one or more embodiments of the present disclosure.

FIGS. 1B and 3C illustrate operation 170 of method 150: exposing the semiconductor substrate 302 to a silicon-containing precursor to selectively deposit a silicon-containing layer 316 on the P-metal layer 314. As used herein, the term "silicon-containing layer" refers to a layer that is formed by exposing the semiconductor substrate to a "silicon-containing precursor." Accordingly, the blocking compound comprising a formula of R—$SiH_3$, where R is an alkyl group, and/or a formula of R—SiCl₃, where R is an alkyl group, may be used to form the blocking layer and does not form a "silicon-containing layer" as described herein.

Any suitable silicon-containing precursor known to the skilled artisan can be used to selectively deposit the silicon-containing layer 316. In some embodiments, the silicon-containing precursor comprises one or more of silane (SiH₄), disilane (Si₂H₆), or trisilane (Si₃H₈).

In some embodiments, the processing conditions for exposing the semiconductor substrate 302 to the silicon-containing precursor to selectively deposit the silicon-containing layer 316 may be controlled.

In one or more embodiments, the silicon-containing layer 316 is deposited on the P-metal layer 314 using a deposition technique, such as, but not limited to, ALD, CVD, PVD, MBE, MOCVD, spin-on, or other insulating layer deposition techniques known to the skilled artisan. In some embodiments, selectively depositing the silicon-containing layer 316 comprises an atomic layer deposition (ALD) process at a temperature in a range of from 300° C. to 500° C.

In some embodiments, the pressure of the processing chamber is controlled. The pressure of the processing chamber may be any suitable pressure for forming the blocking layer. In some embodiments, the pressure of the processing chamber is maintained in a range of from 1 Torr to 50 Torr during formation of the silicon-containing layer 316.

In some embodiments, the time period during which the semiconductor substrate 202 is exposed to the silicon-containing precursor to form the silicon-containing layer 316, is controlled. The time period may be any suitable time period that depends on the other process parameters. In some embodiments, the time period is in a range of from about 5 seconds to about 1000 seconds.

In some embodiments, the silicon-containing layer 316 comprises one or more of silicon (Si) or silicon oxide (SiOx). In some embodiments, the silicon-containing layer 316 comprises a native oxide, such as silicon oxide (SiOx).

The silicon-containing layer 316 may have any suitable thickness. In one or more embodiments, the silicon-containing layer 316 has a thickness in a range of from 2 Å to 10 Å.

Figure 3D:
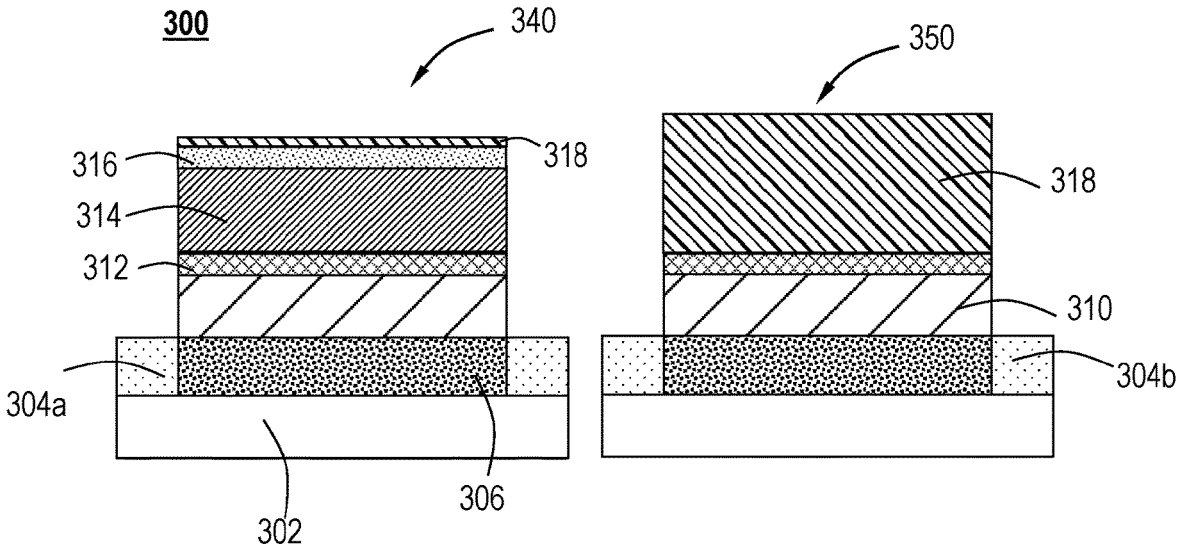
FIG. 3D illustrates a cross-sectional view of a semiconductor substrate according to one or more embodiments of the present disclosure.

FIGS. 1B and 3D illustrate operation 180 of method 150: selectively depositing an N-metal layer 318 on the N-metal stack 350. In some embodiments, operation 130 of method 100 and operation 180 of method 150 are the same.

In some embodiments, at operation 180, the N-metal layer 318 is deposited on the high-κ dielectric layer 312 using a deposition technique, such as, but not limited to, ALD, CVD, PVD, MBE, MOCVD, spin-on, or other insulating layer deposition techniques known to the skilled artisan.

In one or more embodiments, the N-metal layer 318 forms on the silicon-containing layer 316 on the P-metal stack 340. As shown in FIG. 3D, the N-metal layer 318 on the P-metal stack 340 has a thickness that is less than a thickness of the N-metal layer 318 on the N-metal stack 350.

Advantageously, the silicon-containing layer 316 inhibits the growth of the N-metal layer 318 on the P-metal stack 340. It has been advantageously found that the silicon-containing layer 316 on the P-metal stack 340 reduces growth of the N-metal layer 318 on the P-metal stack 340 by greater than or equal to 50%, including greater than or equal to 60%, or greater than or equal to 70%.

In one or more embodiments, the thickness of the N-metal layer 318 on the P-metal stack 340 in a range of from 0.1 Å to 10 Å. In one or more embodiments, the thickness of the N-metal layer 318 on the N-metal stack 350 in a range of from about 1 nm to less than or equal to 5 nm.

The N-metal layer 318 may comprise any suitable metal known to the skilled artisan. In some embodiments, the N-metal layer 318 comprises one or more of aluminum (Al), titanium (Ti), titanium carbide (TiC), titanium aluminum carbide (TiAlC), titanium aluminum silicon (TiAlSi), tantalum (Ta), tantalum carbide (TaC), tantalum aluminum carbide (TaAlC), or tantalum aluminum silicon (TaAlSi).

Advantageously, since the N-metal layer 318 on the P-metal stack 340 has a thickness that is less than a thickness of the N-metal layer 318 on the N-metal stack 350, the N-metal layer growth is inhibited on the P-metal stack 340 and the detrimental effects of the N-metal layer on the P-metal stack are reduced.

Figure 4:
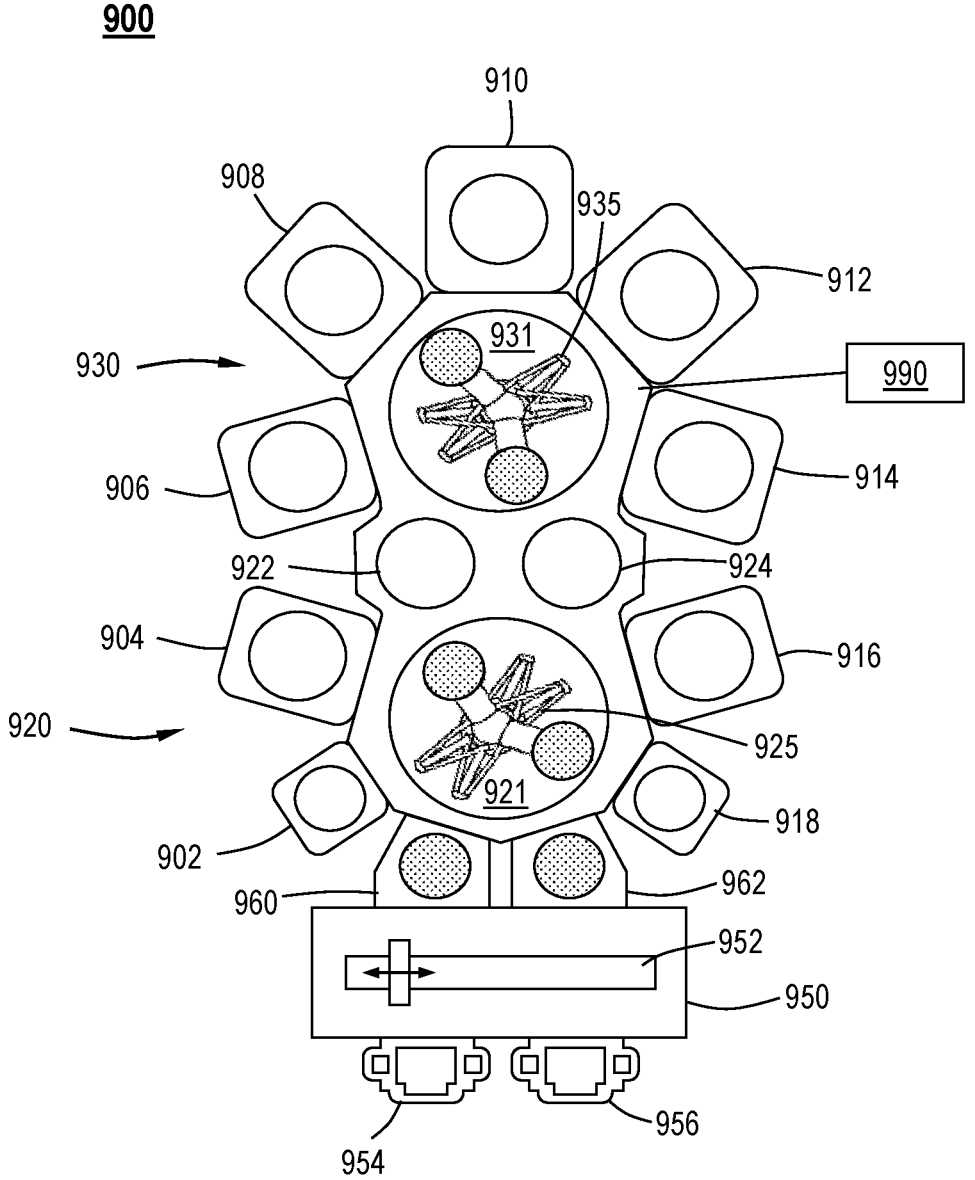
FIG. 4 illustrates a cluster tool according to one or more embodiments of the present disclosure.

Additional embodiments of the disclosure are directed to processing tools (i.e., a cluster tool) 900 for the formation of the logic/memory devices and methods described, as shown in FIG. 4. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station 921, 931. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. In one or more embodiments, the ALD chamber includes a single chamber for forming both of the N-metal stack and the P-metal stack, such that there is no vacuum break in between the operations.

In one or more embodiments, the ALD chamber can include a single chamber for forming each of the N-metal stack and the P-metal stack, such that there is a vacuum break in between at least one of the operations.

The operations of method 100 and method 150 may all be performed within the cluster tool 900 with or without a vacuum break in between the operations. In one or more embodiments, all of the operations of method 100 and method 150 are performed within the cluster tool 900 with no vacuum break in between the operations. Without intending to be bound by any particular theory, it is thought that the greatest inhibition of N-metal layer growth may achieved when there is no vacuum break in between the operations of method 100.

The particular arrangement of process chambers and components can be varied depending on the cluster tool and should not be taken as limiting the scope of the disclosure.

In one or more embodiments, the cluster tool 900 includes a silicon dioxide (SiO₂) chamber to deposit silicon dioxide (SiO₂). The silicon dioxide (SiO₂) deposition chamber of some embodiments comprises an atomic layer deposition chamber, a plasma enhanced atomic layer deposition chamber, or a spatial atomic layer deposition chamber. In one or more embodiments, the cluster tool 900 includes a precleaning chamber connected to the central transfer station.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown in FIG. 4 has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or to allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the methods, such as the method 100 and the method 150, of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes the processing chamber to perform the operations of any of the methods described herein. In one or more embodiments, the controller causes the processing chamber to perform the operations of method 100. In one or more embodiments, the controller causes the processing chamber to perform the operations of method 150.

In one or more embodiments, the processing tool 900 comprises a central transfer station 921, 931 comprising at least one robot 925, 935 configured to move a wafer; one or more of a rapid thermal processing (RTP) station, a decoupled plasma oxidation (DPO), or decoupled plasma nitridation (DPN) station connected to the central transfer station; an atomic layer deposition (ALD) station connected to the central transfer station; an optional pre-clean station connected to the central transfer station; and at least one controller connected to the one or more of the central transfer station, the RTP station, the DPO station, the DPN station, the ALD station or the optional pre-clean station. In one or more embodiments, the at least one controller has at least one configuration selected from: a configuration to move the wafer between stations using the robot; a configuration to perform a rapid thermal process; a configuration to perform a decoupled plasma process; a configuration to control a flow of an oxidizing gas into the RTP station or DPO station; a configuration to control a flow of a nitriding gas into the RTP station or DPN station; a configuration to deposit a silicon oxide film by atomic layer deposition; and a configuration to pre-clean the wafer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:
  forming a P-metal stack and an N-metal stack on a semiconductor substrate, each of the P-metal stack and the N-metal stack formed on a top surface of a channel located between a source and a drain on the semiconductor substrate, forming each of the P-metal stack and the N-metal stack comprising:
    depositing an interfacial layer on the top surface of the channel,
    depositing a high-κ dielectric layer on the interfacial layer, and
    depositing a P-metal layer on the high-κ dielectric layer on the P-metal stack;
  exposing the semiconductor substrate to a blocking compound to selectively deposit a blocking layer on the P-metal layer; and
  selectively depositing an N-metal layer on the N-metal stack.

2. The method of claim 1, wherein the blocking compound comprises a formula of $R_1$—C≡C—$R_2$, where each of $R_1$ and $R_2$ are independently (H) or an alkyl group, a formula of H—C≡C—$R_3$, where $R_3$ is an alkyl group, a formula of R—$SiH_3$, where R is an alkyl group, a formula of R—$SiCl_3$, where R is an alkyl group, or a formula of R—SH, where R is an alkyl group.

3. The method of claim 2, wherein $R_1$ and $R_2$ are the same.

4. The method of claim 1, wherein exposing the semiconductor substrate to the blocking compound is performed at a temperature in a range of from room temperature to 500° C.

5. The method of claim 1, wherein exposing the semiconductor substrate to the blocking compound is performed at a pressure in a range of from 0.1 Torr to 100 Torr.

6. The method of claim 1, wherein the semiconductor substrate is exposed to the blocking compound for a time period in a range of from 0.5 seconds to 1 hour.

7. The method of claim 1, wherein the interfacial layer comprises a silicon oxide (SiOx) layer formed on doped silicon or undoped silicon.

8. The method of claim 1, wherein the high-κ dielectric layer comprises one or more of hafnium oxide (HfOx), hafnium zirconium oxide (HfZrOx), zirconium oxide (ZrOx), nitrogen-doped hafnium oxide (HfOx), nitrogen-doped hafnium zirconium oxide (HfZrOx), and nitrogen-doped zirconium oxide (ZrOx).

9. The method of claim 1, wherein depositing the P-metal layer comprises exposing the semiconductor substrate to a pulse of a metal-containing precursor and a pulse of a reactant by an atomic layer deposition (ALD) process or a chemical vapor deposition (CVD) process.

10. The method of claim 9, wherein the P-metal layer comprises one or more of titanium nitride (TiN), tungsten carbonitride (WCN), tungsten nitride (WN), molybdenum nitride (MoN), tantalum nitride (TaN), niobium nitride (NbN), or titanium silicon nitride (TiSiN).

11. The method of claim 1, wherein the N-metal layer comprises one or more of aluminum (Al), titanium (Ti), titanium carbide (TiC), titanium aluminum carbide (TiAlC), titanium aluminum silicon (TiAlSi), tantalum (Ta), tantalum carbide (TaC), tantalum aluminum carbide (TaAlC), or tantalum aluminum silicon (TaAlSi).

12. The method of claim 1, wherein the blocking layer is configured to prevent deposition of the N-metal layer on the P-metal layer.

13. A method of manufacturing an electronic device, the method comprising:
  forming a P-metal stack and an N-metal stack on a semiconductor substrate, each of the P-metal stack and the N-metal stack formed on a top surface of a channel located between a source and a drain on the semiconductor substrate; forming each of the P-metal stack and the N-metal stack comprising:
    depositing an interfacial layer on the top surface of the channel,
    depositing a high-κ dielectric layer on the interfacial layer, and
    depositing a P-metal layer on the high-κ dielectric layer on the P-metal stack;
  exposing the semiconductor substrate to a silicon-containing precursor to selectively deposit a silicon-containing layer on the P-metal layer; and
  selectively depositing an N-metal layer on the N-metal stack.

14. The method of claim 13, wherein the P-metal layer comprises one or more of titanium nitride (TiN), tungsten nitride (WN), tungsten carbonitride (WCN), molybdenum nitride (MoN), tantalum nitride (TaN), niobium nitride (NbN), or titanium silicon nitride (TiSiN).

15. The method of claim 13, wherein the N-metal layer comprises one or more of aluminum (Al), titanium (Ti), titanium carbide (TiC), titanium aluminum carbide (TiAlC), titanium aluminum silicon (TiAlSi), tantalum (Ta), tantalum carbide (TaC), tantalum aluminum carbide (TaAlC), or tantalum aluminum silicon (TaAlSi).

16. The method of claim 13, wherein the silicon-containing precursor comprises one or more of silane ($SiH_4$), disilane ($Si_2H_6$), or trisilane ($Si_3H_8$).

17. The method of claim 13, wherein selectively depositing the silicon-containing layer comprises an atomic layer deposition (ALD) process at a temperature in a range of from 300° C. to 500° C.

18. The method of claim 17, wherein the silicon-containing layer comprises one or more of silicon (Si) or silicon oxide (SiOx).

19. A method of manufacturing an electronic device, the method comprising:

forming a P-metal stack and an N-metal stack on a semiconductor substrate, each of the P-metal stack and the N-metal stack formed on a top surface of a channel located between a source and a drain on the semiconductor substrate, forming each of the P-metal stack and the N-metal stack comprising:

depositing a silicon oxide (SiOx) layer on the top surface of the channel, depositing a hafnium oxide (HfOx) layer on the SiOx layer, and depositing a titanium nitride (TiN) layer on the HfOx layer on the P-metal stack;

exposing the semiconductor substrate to a blocking compound to selectively deposit a blocking layer on the TiN layer at a temperature in a range of from room temperature to 500° C. and a pressure in a range of from 0.1 Torr to 100 Torr, the blocking compound comprising a formula of $R_1$—C≡C—$R_2$, where each of $R_1$ and $R_2$ are independently (H) or an alkyl group, a formula of H—C≡C—$R_3$, where $R_3$ is an alkyl group, a formula of R—$SiH_3$, where R is an alkyl group, a formula of R—$SiCl_3$, where R is an alkyl group, or a formula of R—SH, where R is an alkyl group; and selectively depositing a titanium aluminum carbide (TiAlC) layer on the N-metal stack.

20. The method of claim 19, wherein the blocking layer is configured to prevent deposition of the TiAlC layer on the TiN layer.

* * * * *